United States Patent [19]
Wardle et al.

[11] Patent Number: 5,117,179
[45] Date of Patent: May 26, 1992

[54] SWEPT SIGNAL ANALYSIS INSTRUMENT AND METHOD

[75] Inventors: Jay M. Wardle, Seattle; Ronald W. Potter, Snohomish; John A. Gibbs, Lynnwood, all of Wash.

[73] Assignee: Hewlett-Packard Company, Palo Alto, Calif.

[21] Appl. No.: 493,590

[22] Filed: Mar. 13, 1990

[51] Int. Cl.$^5$ .................................... G01R 27/02
[52] U.S. Cl. ........................ 324/77 CS; 324/77 C; 324/78 F; 364/485; 455/161.1
[58] Field of Search ............... 375/145, 146, 147, 148; 455/160, 161; 342/14; 324/77 CS, 77 C, 78 F; 364/485

[56] References Cited
U.S. PATENT DOCUMENTS

| | | | |
|---|---|---|---|
| 2,996,667 | 8/1961 | Galbreath | 324/77 C |
| 3,364,426 | 1/1968 | Hurvitz | 324/77 C |
| 3,633,111 | 1/1974 | Smith | 455/161 |
| 3,916,319 | 10/1975 | Hawley | 455/161 |

OTHER PUBLICATIONS

Frederiksen, F. B., "Efficient Continuous-Spectrum Analysis Based on Sweep-Filtering Technics" European Conference on Circuit Theory and Design, Sep. 1989, pp. 60-63.
Goodwin, "Speeding Up Spectrum Analyzer Spurious Testing," Microwaves & RF, Aug. 1987, pp. 107-114.
Tsakiris, "Resolution of a Spectrum Analyzer Under Dynamic Operating Conditions," Rev. Sci. Instrum., vol. 48, No. 11, Nov. 1977, pp. 1414-1419.
Zirwick, "Filters for Spectrum Analyzers," News From Rohde & Schwarz, pp. 25-26, 1971.

Primary Examiner—Kenneth A. Wieder
Assistant Examiner—Jose M. Solis

[57] ABSTRACT

The sweep rate limitations that heretofore have constrained the maximum sweep rates of swept analysis instruments are obviated by optimizing filter circuitry and post-processing the IF signal using various techniques to compensate for errors caused by fast sweeping.

25 Claims, 2 Drawing Sheets

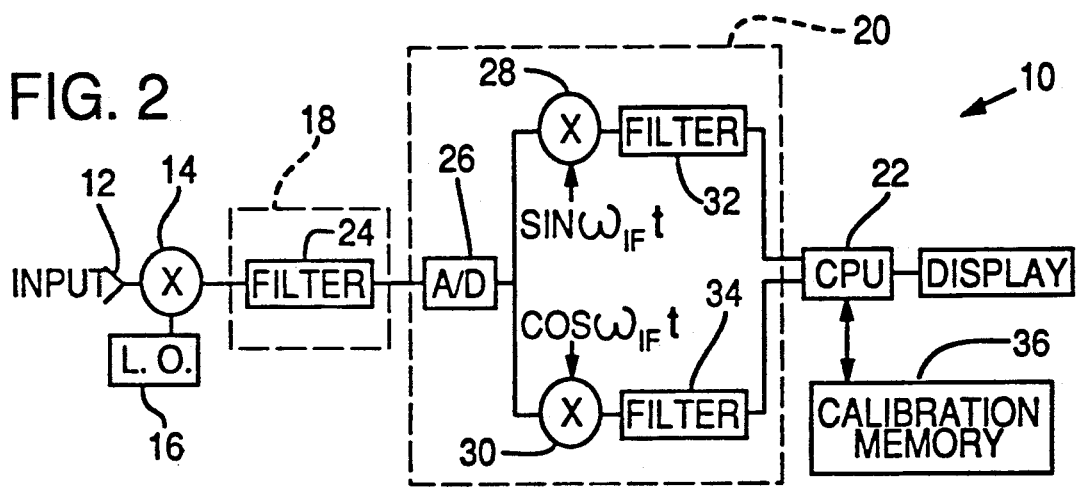
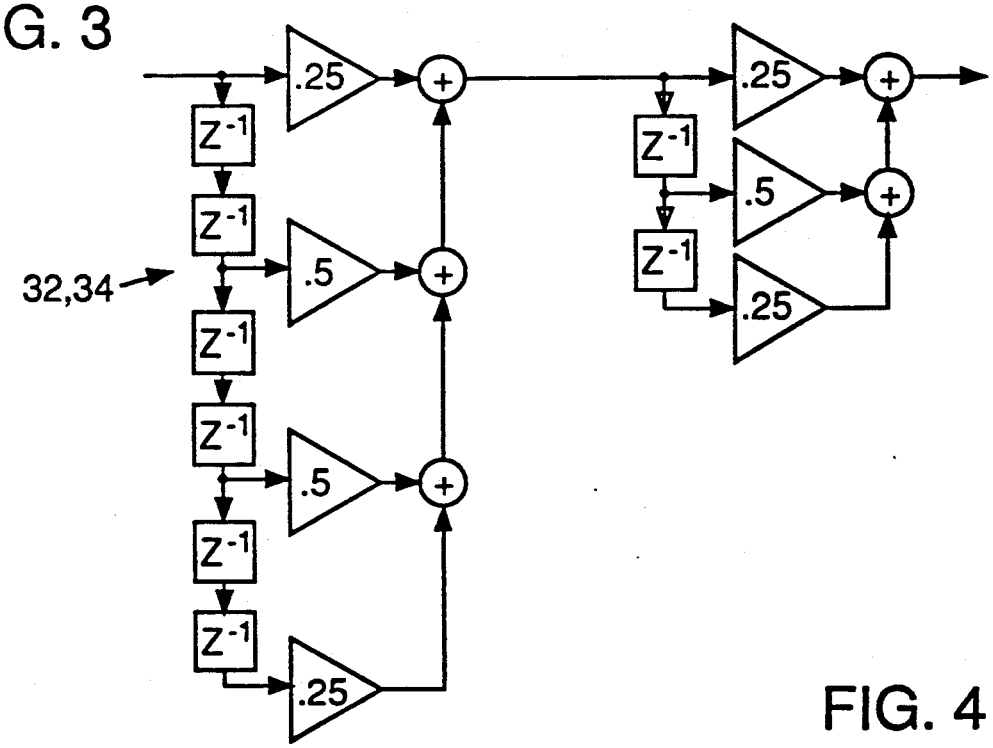
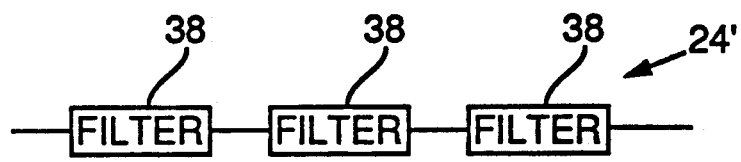
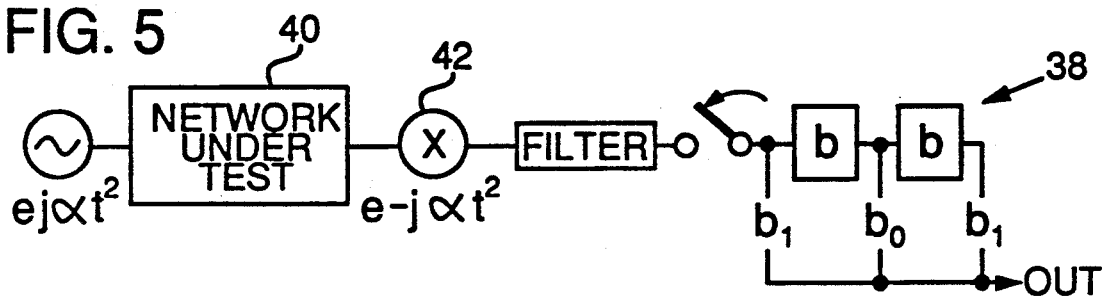

SWEPT SIGNAL ANALYSIS INSTRUMENT AND METHOD

FIELD OF THE INVENTION

The present invention relates to swept signal analysis instruments, such as spectrum analyzers and network analyzers, and more particularly relates to a method and apparatus permitting such instruments to be swept at fast rates.

BACKGROUND AND SUMMARY OF THE INVENTION

The term "swept signal analysis instrument" as used herein is a generic term referring to any electronic equipment in which an input signal is mixed to an intermediate frequency using a swept local oscillator and is subsequently filtered.

The most common swept signal analysis instruments are spectrum analyzers and network analyzers, and it is with reference to these instruments that the present invention is illustrated. In a spectrum analyzer, an input signal to be analyzed is heterodyned to an intermediate frequency (IF) using a swept local oscillator. The IF signal is filtered with a narrow bandwidth IF filter. The swept local oscillator has the effect of "sweeping" all the frequencies of the heterodyned-down input signal past the fixed frequency of the IF filter, thereby permitting the filter to resolve the input signal's spectral composition. The signal power within the filter bandwidth is determined by a detector cascaded after the IF filter and is typically displayed on a graphical display associated with the instrument.

A network analyzer is similar in many respects to a spectrum analyzer but instead of analyzing an unknown signal, the instrument analyzes an unknown network. To do this, the instrument excites the unknown network with a known signal and monitors the phase and amplitude characteristics of a resultant signal, thereby permitting the network's transfer function to be characterized. Again, the instrument relies on a swept local oscillator to heterodyne the input signal to an intermediate frequency, and the IF signal is again filtered prior to analysis. In a network analyzer, however, the IF filter serves to eliminate noise effects rather than to provide a narrow resolution bandwidth, and the filtered IF signal is analyzed to determine the phase and amplitude of the IF signal rather than its power. The analysis further includes "normalizing" the IF signal to the original excitation signal in order to reduce excitation source related errors.

All swept signal analysis instruments suffer from a common limitation, namely measurement errors caused by the sweeping operation. In spectrum analyzers, these errors manifest themselves as a degradation in the performance of the IF filter. As the sweep speed increases, spectral components of the input signal are swept at increased speeds through the filter. The behavior of the filter to these quasi-transient signals can be optimized by using a Gaussian filter response, thereby minimizing conventional dynamic problems such as ringing and overshoot. However, above a certain sweep rate, even an ideal Gaussian filter becomes unsatisfactory due to spreading of the filter passband and errors in amplitude (i.e. power) response. In particular, the filter passband approaches its impulse response shape when the sweep rate increases to infinity, and the amplitude of the response decreases with the square root of the sweep rate.

An ideal Gaussian response is often approximated by cascading a plurality of single-tuned filter stages. (A true Gaussian response cannot be physically realized since it is noncausal.) These cascaded stages generally include capacitors, inductors or crystals, and thus have transfer functions with poles. All transfer functions with poles exhibit non-flat group delay, also known as non-linear phase response. One problem with such filters is that they respond more quickly to the leading edge of an input transient signal than the trailing edge. Another problem is that the trailing edge often exhibits notches and ringing rather than a smooth fall to the noise floor. Small signals are difficult to differentiate from aberrations on the falling edge of nearby larger signals.

These problems, in conjunction with the magnitude errors caused by fast sweeping, have limited traditional analyzers to a maximum sweep rate of one half the filter bandwidth squared (0.5 $BW^2$). At this rate, the magnitude error is about 1.18%, or less than 0.1 dB—generally considered to be an acceptable accuracy.

The mathematical derivation of the amplitude error and of the passband distortion resulting from fast sweeping is set forth in Hewlett-Packard Application Note 63, May 1965 An article by Tsakiris entitled "Resolution of a Spectrum Analyzer Under Dynamic Operating Conditions," Rev. Sci. Instrum., Vol. 48, No. 11, November, 1977 contains a similar analysis for a variety of spectrum analyzer filters.

In network analyzers, sweep related errors manifest themselves as errors in normalization and as irregularities in both the frequency and phase response of the noise limiting filter. Again, these errors increase with sweep speed and limit the maximum rate at which a network analyzer can sweep through a frequency range of interest.

In accordance with the present invention, the sweep rate limitations that heretofore have constrained the maximum sweep rates of swept analysis instruments are obviated by optimizing the filter circuitry and post-processing the IF signal using various techniques to compensate for fast sweeping errors.

The foregoing and additional features and advantages of the present invention will be more readily apparent from the following detailed description thereof, which proceeds with reference to the accompanying drawings.

BRIEF DESCRIPTIONS OF THE DRAWINGS

FIG. 2 is a schematic block diagram of a spectrum analyzer according to one embodiment of the present invention.

FIG. 3 is a schematic block diagram of a digital IF filter used in the spectrum analyzer of FIG. 2.

FIG. 4 is a schematic diagram of an IF filter comprised of a plurality of cascaded synchronously tuned filter stages.

FIG. 5 is a partial schematic block diagram of a network analyzer employing a 3 tap FIR digital filter to correct for a parabolic phase sweeping error.

DETAILED DESCRIPTION

Figure 1:
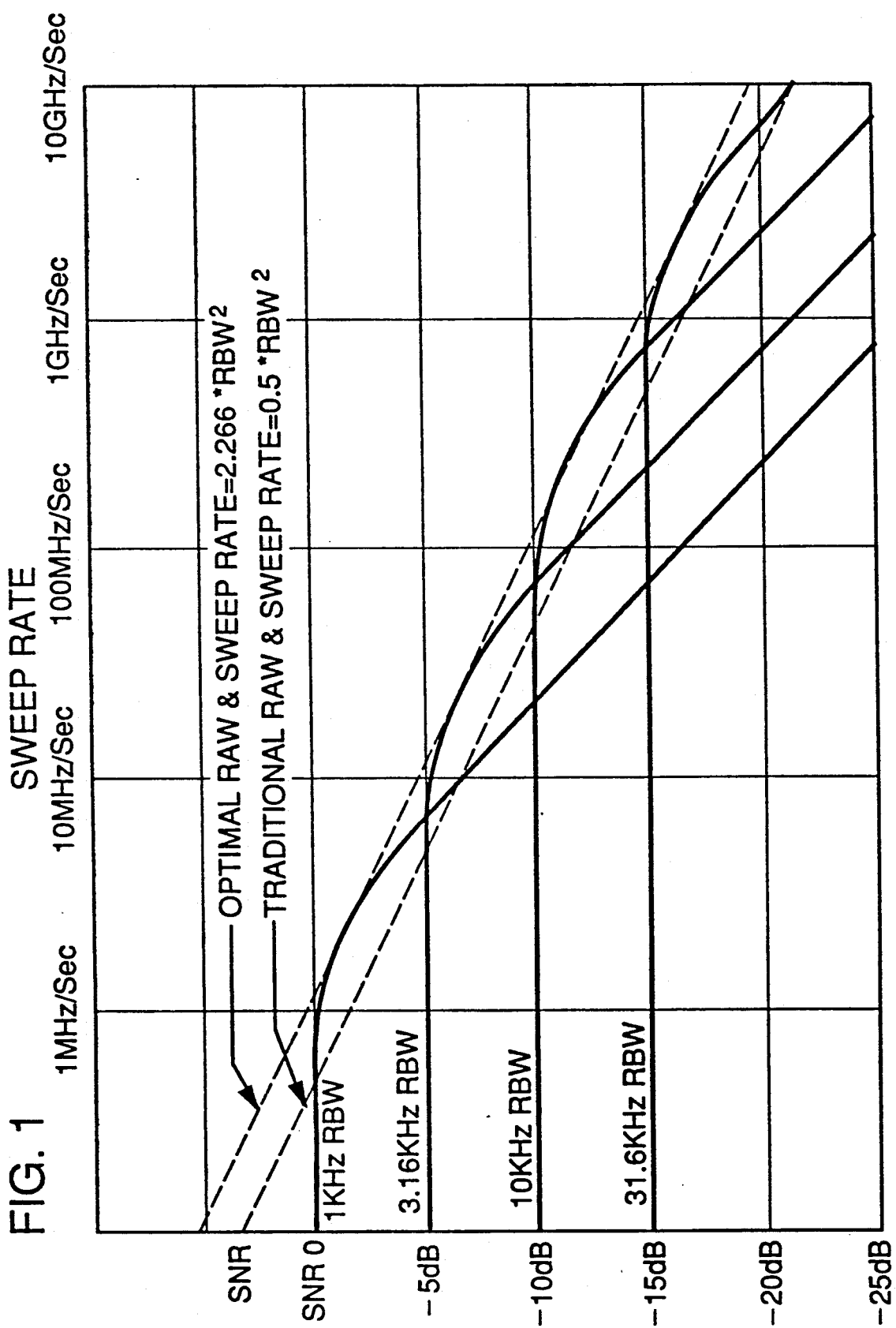
FIG. 1 is a plot showing several bandwidths of Gaussian filter over several decades of sweep rate.

Analysis of the response of an ideal Gaussian filter to swept frequency input signals shows that the response is both perfectly predictable and that none of the distortion apparent in traditional implementations exists.

Improved filters, with close to Gaussian magnitude response and flat group delay, may be "overswept." The amplitude of stationary signals decreases in a predictable manner that is a function of the bandwidth and the sweep rate, and that amplitude change may be used as compensation to provide accurate amplitude measurements.

Analysis also shows that, for a fixed sweep rate, a narrower than traditional bandwidth actually provides an improved signal to noise ratio. The signal to noise ratio is maximized when the sweep rate and resolution (filter) bandwidth are related by the following equation:

$$\text{Sweep rate} = 2.266(BW^2) \quad (1)$$

In this event, the signal to noise ratio is almost 2 dB better than at traditional bandwidths. This is due to the fact that the signal level decreases only about 1 dB because of the "oversweeping," while the noise level decreases about 3 dB.

FIG. 1 shows several bandwidths of Gaussian filter over several decades of sweep rate. The effect of different sweep rates and bandwidths on signal to noise ratio can readily be seen.

A further aspect of swept spectrum analysis that is improved by this invention is frequency resolution of signals. Improved resolution means being able to differentiate signals that are closer together. A useful concept to introduce is that of "apparent resolution." This is defined as the bandwidth of the swept response at some appropriate level below the peak response.

It is generally known that the response of a filter to a swept signal approaches the steady state frequency response when swept slowly, and the filter's response approaches its impulse response when swept very quickly. An ideal Gaussian frequency response filter has a Gaussian impulse response. The apparent resolution of a Gaussian filter is exactly its resolution bandwidth when swept slowly. As a Gaussian filter is swept more quickly, the apparent resolution gets wider, but the response remains Gaussian. Even at traditional sweep rates, the apparent resolution is a few percent wider than the nominal resolution bandwidth.

Further analysis shows that, for a fixed sweep rate, the apparent resolution is narrower when the actual bandwidth is less than traditional. This is due to the fact that, although the apparent resolution of the filter gets wider when overswept, the starting resolution was better. In fact, the optimal filter bandwidth for minimum apparent resolution is the same filter bandwidth that maximizes signal to noise ratio. The apparent resolution gets worse for even smaller bandwidths because the filter response is approaching its impulse response. The length of the impulse response varies inversely as the bandwidth.

With the foregoing as background, and referring to FIG. 2, a spectrum analyzer 10 according to one embodiment of the present invention includes an analog input 12, a mixer 14 with an associated swept local oscillator 16, an analog IF chain 18, analog-to-quadrature digital conversion circuitry 20, and post-processing circuitry 22.

The analog IF chain 18 includes an IF filter 24 that sets the resolution bandwidth of the analyzer. According to one embodiment of the present invention, the behavior of this filter is optimized by improving its phase response and group delay characteristics.

It will be recognized that filter 24 may take several forms. In one embodiment, the filter is implemented in analog form, with cascaded lumped elements or crystals, or surface acoustic wave technology. Such filters can be equalized to yield magnitude response close to Gaussian, effectively eliminating unacceptable responses that cause distortions in the detected spectrum. In other embodiments, the filter is implemented in a finite-impulse-response (FIR) design, thereby achieving perfectly flat group delay. (In this latter embodiment, of course, the IF signal must be converted into digital form prior to filtering.) Again, nearly Gaussian response can be obtained, thereby greatly reducing filter-induced distortion mechanisms.

The analog-to-quadrature digital conversion circuitry 20 includes an analog-to-digital converter circuit 26, a pair of mixers 28, 30, and a corresponding pair of low pass filters 32, 34 (which preferably have a linear phase [flat group delay] characteristic). The analog-to-digital converter 26 samples the IF signal at periodic intervals and outputs a series of digital data samples corresponding thereto. These digital samples are multiplied with $\sin\omega t$ and $\cos\omega t$ signals by the mixers 28, 30 to yield digital representations of the real and imaginary components of the IF signal. Linear-phase (or flat group delay) filters 32, 34 filter the quadrature signals at baseband, equivalent to providing a linear-phase (or flat group delay) filter centered at the frequency $\omega_{IF}/2\pi$ Hz.

Quadrature analog-to-quadrature digital conversion circuitry 20 is generally known in the art, as described, inter alia, in U.S. Pat. No. 4,594,555, the disclosure of which is incorporated herein by reference.

The filters 32, 34 in the illustrated embodiment are implemented digitally, as shown in FIG. 3. In the illustrated filter topology, the tap coefficients are selected to be powers of two, thereby permitting the use of bit shifters instead of multiplier stages. Each filter is implemented with 24-bit logic and a sample clock rate of 250 KHz to provide a filter bandwidth of 18 KHz. (Actually, a single filter is used for both real and imaginary data by multiplexing data through the filter at twice the sample rate.) Narrower filter widths can be achieved by filtering the IF signal repeatedly through IF filter 24, effectively halving the data bandwidth and sample rate for each pass through the filter. (The theory and implementation of such "decimation" filtering is provided in U.S. Pat. No. 4,881,191, which is also incorporated herein by reference.) Of course, filters 32, 34 can alternatively be implemented in analog form, if desired.

Even with the use of a Gaussian filter response, the analyzer will still exhibit an amplitude decrease of about 0.1 dB when swept at 0.5 $BW^2$, and more at faster rates. This amplitude decrease can be corrected by predicting the loss and applying a compensating sweep-dependent gain. The gain can be applied any place in the signal path. In most implementations, the compensating gain is applied in a CPU controlled post-processing stage 22 that may include a calibration memory 36.

The required compensation can be predicted in at least three ways. In the first, it can be computed using the solution of a swept Gaussian response. This approach is attractive because the solution exists in closed-form equations (as shown in the Tsakiris paper, supra) and is thus computationally efficient. In the second technique, the required compensation can be simulated, such as by using a computer model of the actual filter.

This approach is more precise than approximating the true filter response as Gaussian, but is more computationally intensive. However, simulations can be performed at a number of sweep rates, and the compensations saved in a table for later use. Compensations for sweep rates other than the ones simulated can be interpolated from the values in the table. In the third compensation technique, the required compensation can be actually measured in the spectrum analyzer system. This can be done by sweeping through a known amplitude signal at the desired rate and measuring the decrease in amplitude. This is attractive because it takes variations in each individual instrument into account. Again, interpolation can be used to minimize the number of measurements that have to be made.

The fast sweeping also introduces an apparent frequency shift in the resulting data. This frequency shift can also be predicted (either in closed mathematical form [the formula is given in the Tsakiris paper]) or by one of the other techniques noted above. Once predicted, it can similarly be compensated for.

It will be recognized that the above-described embodiment provides several improvements to the art. One is the use of approximately gaussian filters of linear phase to a signal analysis instrument. While the amplitude response of such a filter may not be a substantial improvement over prior art cascaded synchronous single-tuned filter stages, the phase response is. That is, the linear-phase filtering employed in the illustrative embodiment offers the instrument a symmetric passband with essentially no ringing under dynamic conditions. The Tsakiris article indicates that asymmetric passband and dynamic ringing are unavoidable in such instruments.

Another improvement is the improved sensitivity and resolving power that can be achieved by "oversweeping" using a smaller than traditional bandwidth. Again, the Tsakiris article indicates that fast sweeping is to be avoided because it leads to a degradation of resolution and sensitivity.

In a second embodiment of the present invention, the IF filter 24 can be implemented using a conventional arrangement of a plurality of cascaded single tuned filter stages 38, as shown by filter 24' in FIG. 4. In this case, the resulting amplitude loss can again be predicted using any of the three methods detailed above and can be compensated accordingly. Since the cascaded stages exhibit a non-flat group delay, the filter also introduces a time delay, which translates into a frequency offset. This error term, too, can be predicted and corrected.

The same basic principles can be used to increase the sweep rate of a network analyzer. In this case, the error mechanisms include errors in normalization of the network output signal due to fast sweeping, and the errors caused by sweeping through the parabolic phase characteristic of the instrument's IF (aka noise limiting) filter. These error mechanisms can be determined and compensated.

FIG. 5 shows a network analyzer 38 used to analyze a network under test 40. The analyzer 38 includes a swept mixer 42, an IF filter 44, and a simple 3-tap FIR filter 46 cascaded after IF filter 44 to mitigate the effects of parabolic phase errors. The coefficients (symmetrical) for the filter 46 are given by the following formulas:

$$b_1 = j/4\alpha T^2 \quad (2)$$

$$b_0 = 1 - (j/2\alpha T^2) \quad (3)$$

More complex filter topologies (i.e. more taps) can be used to yield commensurately better error compensation.

Another technique of compensating for the parabolic phase error is to add the results an increasingfrequency sweep to the conjugate of a corresponding decreasing-frequency sweep.

Yet another technique to equalize the parabolic phase error is to perform a Fourier transform on the raw data, multiply by a parabolic phase term, and then perform an inverse Fourier transform.

A final technique to compensate the parabolic phase error is by use of a parallel filter equalizer.

It will be recognized that the analyzer filter 44 windows the frequency transform of the network under test. The shape of this windowing function can be selected to optimize fast sweep speed performance.

If, at the desired sweep rate, the impulse response of the network under test falls entirely within the filter, then the filter should be flat to give a uniform window.

If, on the other hand, significant energy falls outside of the filter, then an exponential window will be found advantageous.

A variety of other windowing functions are advantageous for different circumstances. Accordingly, it is desirable to provide the instrument with a plurality of windowing functions and means for selecting therebetween. The preferred implementation is to provide a single filter and to implement the different windowing functions digitally. (Window selection is known in digital signal analyzers, but has not heretofore been employed in network analyzers.) In such an embodiment, a desirable filter is the Nyquist zero symbol interference filter.

It will be recognized that all the foregoing error compensation techniques are independent of the network under test.

Having described and illustrated the principles of our invention with reference to preferred embodiments thereof, it will be apparent that invention can be modified in arrangement and detail without departing from such principles. For example, while the spectrum analyzer is illustrated with reference to a digital IF filter, it will be recognized that a variety of other filters may alternatively be used. For example, surface acoustic wave (SAW) filters can be used and can be made to have nearly flat group delay characteristics. In view of the many possible embodiments to which the principles of our invention may be put, it should be recognized that the detailed embodiments are illustrative only and should not be taken as limiting the scope of our invention. Rather, we claim as my invention all such embodiments as may come within the scope and spirit of the following claims and equivalents thereto.

We claim:

1. In a method of spectral analysis comprising the steps:

sweeping a variable frequency oscillator to mix an input signal to an intermediate frequency signal;

filtering the intermediate frequency signal with a filter having a bandwidth BW for resolving a subband of frequencies; and detecting the spectral power of the intermediate frequency signal within the filtered subband of frequencies to thereby determine data representing the power of the input signal as a function of frequency;

an improvement wherein;

the sweeping step comprises sweeping at a rate faster than 0.5 BW$^2$;

and in which the method further includes compensating for errors introduced into said data by the fast sweeping.

2. The method of claim 1 in which the compensating step includes compensating for frequency shift errors introduced by the fast sweeping.

3. The method of claim 1 in which the compensating step includes compensating for detected power errors introduced by the fast sweeping.

4. The method of claim 1 in which the filtering step includes approximating a Gaussian filtering response by filtering the intermediate frequency signal through a plurality of cascaded filter stages with non-flat group delay..

5. In a method of spectral analysis comprising the steps:

sweeping a variable frequency oscillator to mix an input signal to an intermediate frequency signal;

filtering the intermediate frequency signal to resolve a subband of frequencies having a bandwidth BW therefrom; and detecting the spectral power of the filtered subband of frequencies to thereby determine the power of the input signal as a function of frequency;

an improvement wherein:

the filtering step includes filtering with a substantially Gaussian response and substantially flat group delay; and the sweeping step comprises sweeping at a rate faster than 0.5 BW$^2$.

6. The method of claim 5 in which the sweeping step comprises sweeping at a rate of approximately 2.266 BW$^2$.

7. The method of claim 5 in which the filtering step includes filtering with a filter having non-flat group delay and phase compensating said filtering to provide filtering with a substantially flat group delay.

8. The method of claim 5 in which the filtering step includes filtering with a finite-impulse-response filter.

9. The method of claim 5 in which the filtering step includes filtering with a surface acoustic wave filter.

10. The method of claim 5 which further includes compensating for errors in the detected power introduced by said fast sweeping.

11. The method of claim 10 in which the compensating step includes computing, using closed-form mathematical equations, the filtering losses associated with an ideal Gaussian filter at a given sweep rate and compensating therefor.

12. The method of claim 10 in which the compensating step includes simulating actual filtering losses and compensating therefor.

13. The method of claim 12 which further includes:
simulating actual filtering losses at a plurality of discrete sweep rates;
storing data corresponding thereto; and
interpolating from said stored data to estimate filtering losses at a given sweep rate.

14. The method of claim 10 in which the compensating step includes measuring actual filtering losses and compensating therefor.

15. The method of claim 14 which further includes:
measuring the actual filtering losses at a plurality of discrete sweep rates;
storing data corresponding thereto; and
interpolating from said stored data to estimate filtering losses at a given sweep rate.

16. The method of claim 5 which further includes compensating for frequency shift errors introduced by said fast sweeping.

17. The method of claim 1 in which the filtering step includes filtering with a finite impulse response digital filter.

18. The method of claim 17 in which the filtering step includes filtering with a finite impulse response digital filter that has symmetrical coefficients to provide a flat group delay.

19. The method of claim 8 in which the filtering step includes filtering with a finite impulse response digital filter that has symmetrical coefficients to provide a flat group delay.

20. In a method of spectral analysis comprising the steps:

sweeping a variable frequency oscillator to mix an input signal to an intermediate frequency signal;

filtering the intermediate frequency signal with a filter having a bandwidth BW for resolving a subband of frequencies therefrom; and detecting the spectral power of the intermediate frequency signal within the subband of frequencies to thereby determine data representing the power of the input signal as a function of frequency;

an improvement wherein:

the sweeping step comprises sweeping at a rate faster than 0.5 BW$^2$;

and in which the method further includes processing said data to compensate for errors introduced by the fast sweeping.

21. The method of claim 20 in which the processing step includes processing said data to compensate for frequency shift errors introduced by the fast sweeping.

22. The method of claim 20 in which the processing step includes processing said data to compensate for detected power errors introduced by the fast sweeping.

23. The method of claim 20 in which the filtering step includes approximating a Gaussian filtering response by filtering the intermediate frequency signal through a plurality of cascaded filter stages with non flat group delay.

24. The method of claim 20 in which the filtering step includes filtering with a finite impulse response digital filter.

25. The method of claim 24 in which filtering step includes filtering with a finite impulse response digital filter that has symmetrical coefficients to provide a flat group delay.

* * * * *